United States Patent
Kato et al.

(10) Patent No.: US 11,935,813 B2
(45) Date of Patent: Mar. 19, 2024

(54) SEMICONDUCTOR DEVICE

(71) Applicant: FUJI ELECTRIC CO., LTD., Kawasaki (JP)

(72) Inventors: Ryoichi Kato, Matsumoto (JP); Tatsuhiko Asai, Hino (JP); Kento Shirata, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 60 days.

(21) Appl. No.: 17/365,100

(22) Filed: Jul. 1, 2021

(65) Prior Publication Data

US 2022/0005745 A1  Jan. 6, 2022

(30) Foreign Application Priority Data

Jul. 6, 2020  (JP) .................................. 2020-116687

(51) Int. Cl.
*H01L 23/36* (2006.01)
*H01L 23/40* (2006.01)
(Continued)

(52) U.S. Cl.
CPC .... *H01L 23/4006* (2013.01); *H01L 23/49822* (2013.01); *H01L 23/49838* (2013.01); *H01L 25/0655* (2013.01); *H01L 2023/4068* (2013.01); *H01L 2023/4087* (2013.01); *H01L 23/49811* (2013.01)

(58) Field of Classification Search
CPC ...... H01L 23/36; H01L 23/373; H01L 23/367
See application file for complete search history.

(56) References Cited

U.S. PATENT DOCUMENTS 11,032,942 B2  6/2021  Kempers et al.
2009/0200065 A1*  8/2009  Otoshi ................... H05K 3/341
                                                                    174/252
(Continued)

FOREIGN PATENT DOCUMENTS

JP  2009-081242 A  4/2009
JP  5383599 A  1/2014
(Continued)

OTHER PUBLICATIONS

Young's Modulus, Tensile Strength and Yield Strength Values for some Materials (2023) (retrieved from 2023) (retrivied from https://www.engineeringtoolbox.com/young-modulus-d_417.html) (Year: 2023).*

(Continued)

*Primary Examiner* — Michele Fan
(74) *Attorney, Agent, or Firm* — Manabu Kanesaka (57) ABSTRACT

A semiconductor device includes a semiconductor module having a wiring board, semiconductor assemblies that include a multilayer substrate on which semiconductor elements are mounted, and a sealing part; a cooler; and a heat conduction sheet which is placed between the semiconductor module and the mounting surface of the cooler and which is in contact with the bottom surfaces of the multilayer substrates. The heat conduction sheet has recesses corresponding to at least parts of the outer edges of second electrically conductive plates provided on the bottoms of the multilayer substrates.

18 Claims, 8 Drawing Sheets

(51) Int. Cl.
*H01L 23/498* (2006.01)
*H01L 25/065* (2023.01)

(56) References Cited

U.S. PATENT DOCUMENTS

| | | | | |
|---|---|---|---|---|
| 2010/0002397 | A1* | 1/2010 | Toh | H01L 23/473 |
| | | | | 361/713 |
| 2010/0002399 | A1* | 1/2010 | Mori | H01L 23/367 |
| | | | | 361/719 |
| 2014/0374896 | A1* | 12/2014 | Nishida | H01L 23/4006 |
| | | | | 438/122 |
| 2020/0161256 | A1* | 5/2020 | Kaneko | H01L 23/3107 |
| 2020/0247963 | A1* | 8/2020 | Ito | C08L 23/16 |

FOREIGN PATENT DOCUMENTS

| | | | |
|---|---|---|---|
| JP | 5383599 B2 | * | 1/2014 |
| JP | 2016-533634 A | | 10/2016 |
| JP | 2020-087966 A | | 6/2020 |

OTHER PUBLICATIONS

Definition of "corresponding", https://dictionary.cambridge.org/us/dictionary/english/ (2023) (Year: 2023).*

Definition of "corresponding", http://www.merriam-webster.com (2023) (Year: 2023).*

* cited by examiner

SEMICONDUCTOR DEVICE

RELATED APPLICATIONS

The present application is based on, and claims priority from, Japanese Application No. 2020-116687 filed Jul. 6, 2020, the disclosure of which is hereby incorporated by reference herein in its entirety.

BACKGROUND OF THE INVENTION

1. Field of the Invention

The present invention relates to a semiconductor device having a heat conduction sheet placed between a semiconductor module and a cooler.

2. Description of the Related Art

A power semiconductor module used as a switching device for power conversion is adversely affected by heat generated from a power semiconductor device or the like in some cases. In order to suppress this, a heat conduction layer, a cooler, and the like for heat dissipation are used for a power semiconductor.

For example, the heat generated during the operation of a power semiconductor of a power semiconductor module is transferred to a cooler (radiating fin) through a heat conduction layer between the power semiconductor module and the cooler so as to cool the heated power semiconductor device and the like.

If a heat conduction layer is not provided, then an air layer with low thermal conductivity is inconveniently formed due to the unevenness of the surface of contact between the semiconductor module and the cooler, thus preventing the dissipation of the heat generated at chips. Therefore, a heat conduction layer of grease or the like is usually used. However, there are cases where, as an operating temperature Tjmax of a power semiconductor device rises, thermal resistance increases due to occurrence of grease outflow or pump-out during $\Delta TjP/C$ and $\Delta TcP/C$ tests.

For example, Patent Document 1 given below discloses a highly viscous grease that is adapted to be easily applied at the time of application and less likely to be pumped out during a reliability test and in the actual use by changing the viscosity at the time of applying the grease and after the application (paragraph 0019 and FIG. 3).

In recent years, use of a heat conductive material such as a carbon sheet has been studied, and there has also been a study on attaching such a heat conductive material to the lower surface of a semiconductor module thereby to conduct generated heat to a cooler.

Patent Document 1: Japanese Patent No. 5383599

However, there is a problem in that, because a carbon sheet is a relatively hard material, when a semiconductor module is screwed to a cooler through the intermediary of the carbon sheet or when a reliability test is performed, a force is applied to a sealing resin in a direction opposite from the direction in which the semiconductor module warps, thus causing damage to the sealing resin of the semiconductor module.

SUMMARY OF THE INVENTION

The present invention has been made in view of the aforesaid problem, and an object of the invention is to provide a semiconductor device that exhibits high heat dissipation performance while preventing damage to a semiconductor module at the same time.

To this end, a semiconductor device in accordance with the present invention includes: a semiconductor module having at least one semiconductor assembly composed of a multilayer substrate which has an electrically conductive plate provided on a bottom surface side of an insulating substrate and a semiconductor element mounted on the multilayer substrate, and a sealing part which seals the at least one semiconductor assembly except a bottom part of the electrically conductive plate; a cooler which has a mounting surface on which the semiconductor module is mounted; and a heat conduction sheet which is placed between the semiconductor module and the mounting surface of the cooler and is in contact with a bottom surface of the multilayer substrate, wherein the heat conduction sheet has a recess corresponding to at least a part of an outer edge of the bottom part of the electrically conductive plate.

In the semiconductor device in accordance with the present invention, the heat conduction sheet is provided between the semiconductor module and the cooler, and the heat generated at the semiconductor assembly in the semiconductor module is conducted to the cooler through the intermediary of the heat conduction sheet so as to be dissipated.

The semiconductor assembly is sealed by the sealing part, and if the semiconductor module warps, the sealing part cracks in some cases. Regarding this problem, according to the present invention, the heat conduction sheet is provided with a recess that corresponds to the outer edge of the bottom part of the electrically conductive plate, so that the electrically conductive plate enters the recess when warp occurs, thus preventing the heat conduction sheet from generating a repulsive force. The term "recess" in this case includes a cutout recess passing through to the bottom surface side of the heat conduction sheet. Consequently, the semiconductor device in accordance with the present invention can maintain high heat dissipation performance while preventing a crack in the sealing part caused by a repulsive force, that is, damage to the semiconductor module.

In the semiconductor device in accordance with the present invention, preferably, the semiconductor module has an M number (M: even number) of the semiconductor assemblies, each of the electrically conductive plates of the M number of the semiconductor assemblies has an edge that extends in the lateral direction of the semiconductor module, and the recess has a shape that corresponds to the mutually opposing edges of the electrically conductive plate of the semiconductor assembly.

Each of the electrically conductive plates of the M number (M: even number) of the semiconductor assemblies has the edge that extends in the lateral direction of the semiconductor module. The recess has a shape corresponding to the mutually opposing edges of the electrically conductive plate (all recesses need not have the same shape). Consequently, in the semiconductor device in accordance with the present invention, if the semiconductor module warps in the longitudinal direction thereof, the electrically conductive plate enters the recess, thus making it possible to prevent damage to the semiconductor module.

Further, in the semiconductor device in accordance with the present invention, preferably, the mutually opposing edges are two mutually adjacent edges of the electrically conductive plates of the semiconductor assemblies that are adjacent to each other at a center of the semiconductor module.

For example, when the semiconductor module has two semiconductor assemblies, each of the electrically conductive plates has two edges extending in the lateral direction, that is, a total of four edges exists. The recesses have shapes corresponding to two mutually adjacent edges among the four edges of the electrically conductive plates of the semiconductor assemblies that are adjacent to each other. This enables the semiconductor device in accordance with the present invention to have the recesses serving as the measures for dealing with forward warping, in which both ends in the longitudinal direction of the semiconductor module are lifted.

Further, in the semiconductor device in accordance with the present invention, preferably, each of the electrically conductive plates of the M number of the semiconductor assemblies further has an edge extending in the longitudinal direction of the semiconductor module, and the recess has a shape corresponding to the edge in the longitudinal direction.

Each of the electrically conductive plates of the M number (M: even number) of the semiconductor assemblies further has two edges extending in the longitudinal direction of the semiconductor module. The recesses have shapes corresponding to the edges (all recesses need not have the same shape). Consequently, in the semiconductor device in accordance with the present invention, if the semiconductor module warps in the lateral direction or the longitudinal direction thereof, then the electrically conductive plates enter the recesses, thus making it possible to prevent damage to the semiconductor module.

Further, in the semiconductor device in accordance with the present invention, preferably, the semiconductor module has an N number (N: odd number) of semiconductor assemblies placed in the longitudinal direction of the semiconductor module, one of the N number of the semiconductor assemblies is placed on a region at the center in the longitudinal direction, and the heat conduction sheet has a recess corresponding to a centerline extending in the lateral direction of the semiconductor module.

For example, if the semiconductor module has three semiconductor assemblies, then position of the centerline extending in the lateral direction of the electrically conductive plate of the semiconductor assembly placed on the region at the center in the longitudinal direction is a position of protrusion downward when the forward warping takes place. Consequently, in the semiconductor device in accordance with the present invention, providing the heat conduction sheet with the recess corresponding to the centerline enables the recess to provide the measures for dealing with the forward warping of the semiconductor module. If the semiconductor module has one semiconductor assembly, then a recess corresponding to the centerline extending in the lateral direction of the only multilayer substrate may be provided.

Further, in the semiconductor device in accordance with the present invention, preferably, the semiconductor module has an N number (N: odd number) of the semiconductor assemblies, each of the electrically conductive plates of the N number of semiconductor assemblies has an edge that extends in the lateral direction of the semiconductor module, and the recess has a shape that corresponds to the mutually opposing edges of the electrically conductive plate of the semiconductor assembly.

Each of the electrically conductive plates of the N number (N: odd number of the semiconductor assemblies has the edge that extends in the lateral direction of the semiconductor module. The recess has a shape corresponding to the mutually opposing edges of the electrically conductive plate (all recesses need not have the same shape). Consequently, in the semiconductor device in accordance with the present invention, if the semiconductor module warps in the longitudinal direction thereof, the electrically conductive plate enters the recess, thus making it possible to prevent damage to the semiconductor module.

Further, in the semiconductor device in accordance with the present invention, preferably, the mutually opposing edges are two mutually adjacent edges of the electrically conductive plates of the semiconductor assemblies that are adjacent to each other.

For example, when the semiconductor module has three semiconductor assemblies, each of the electrically conductive plates has two edges extending in the lateral direction, and a total of six edges exist. The recesses have shapes corresponding to four mutually adjacent edges among the six edges of the electrically conductive plates of the semiconductor assemblies that are adjacent to each other. This enables the semiconductor device in accordance with the present invention to have the recesses serving as the measures for dealing with the forward warping of the semiconductor module.

Further, in the semiconductor device in accordance with the present invention, preferably, each of the electrically conductive plates of the N number of the semiconductor assemblies further has an edge extending in the longitudinal direction of the semiconductor module, and the recess has a shape corresponding to the edge in the longitudinal direction.

Each of the electrically conductive plates of the N number (N: odd number) of the semiconductor assemblies further has two edges extending in the longitudinal direction of the semiconductor module. The recesses have shapes corresponding to the edges (all recesses need not have the same shape). Consequently, in the semiconductor device in accordance with the present invention, if the semiconductor module warps in the lateral direction or the longitudinal direction thereof, then the electrically conductive plates enter the recesses, thus making it possible to prevent damage to the sealing part.

In the semiconductor device in accordance with the present invention, the recesses corresponding to the two mutually adjacent edges may be integrated into a common recess.

The recesses corresponding to the two mutually adjacent edges that are provided in a region between a plurality of multilayer substrates are made common. This enables the electrically conductive plate or plates of the bottom part or parts of either one or both of the multilayer substrates to enter the common recess.

Further, in the semiconductor device in accordance with the present invention, the heat conduction sheet preferably has a sloped portion that makes the heat conduction sheet thinner toward the recess.

The sloped portion is provided such that the thickness of the heat conduction sheet decreases toward the recess, because the semiconductor module frequently warps in the longitudinal direction thereof. With this sloped portion, when warping occurs, the multilayer substrate tilts along the sloped portion and the electrically conductive plate on the bottom part thereof enters the recess, thus making the sealing part less likely to be subjected to a repulsive force.

Further, in the semiconductor device in accordance with the present invention, a Young's modulus Y of the heat conduction sheet preferably satisfies a condition of $1\ \mathrm{Pa} \leq Y \leq 200\ \mathrm{Pa}$.

A material that satisfies the aforesaid condition is used for the heat conduction sheet. Consequently, when the heat conduction sheet is pressed and deformed or the semiconductor module is warped, the heat generated in the multilayer substrate is reliably conducted to the cooler by adapting to such deformation or warping.

Further, in the semiconductor device in accordance with the present invention, the heat conduction sheet is preferably formed of a carbon sheet.

A carbon sheet has high heat conductivity and therefore exhibits high heat dissipation performance. In addition, a carbon sheet is a thin, hard material, thus enabling the recesses to be easily formed.

Further, in the semiconductor device in accordance with the present invention, preferably, both end portions of the heat conduction sheet other than a central portion thereof are thicker than the central portion where the multilayer substrate is placed.

With this configuration, the central portion of the heat conduction sheet is made thinner to adapt to the warping of the semiconductor module, thereby maintaining the heat dissipation performance. On the other hand, both end portions of the heat conduction sheet are made relatively thick so as to make it possible to reduce a stress generated in the entire semiconductor module.

Further, in the semiconductor device in accordance with the present invention, when the thickness of both end portions is denoted as x, and the thickness of the central portion is denoted as y, a relationship of $2y<x<3y$ preferably holds.

With this configuration, the heat conduction sheet is designed such that the central portion and both end portions thereof satisfy the aforesaid condition. This makes it possible to further improve the heat dissipation performance and to reduce the stress generated in the entire semiconductor module.

DESCRIPTION OF THE PREFERRED EMBODIMENTS

The following will describe embodiments of a semiconductor device in accordance with the present invention with reference to the accompanying drawings.

Figure 1:
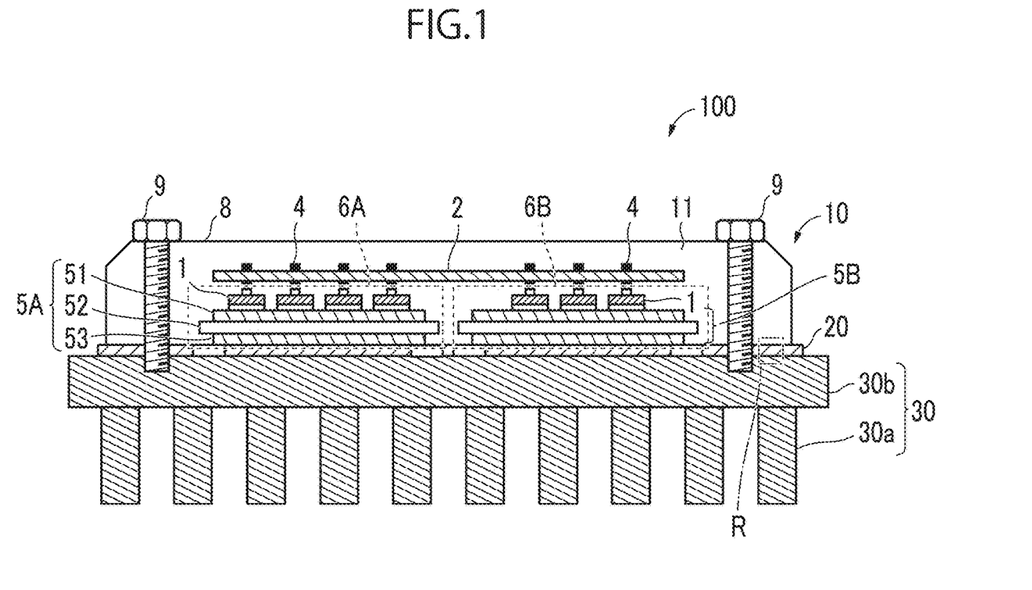
FIG. 1 is a sectional view of a semiconductor module according to an embodiment of the present invention.

FIG. 1 is a sectional view of a semiconductor device 100 according to an embodiment of the present invention. First, a semiconductor module 10 is composed primarily of semiconductor elements 1, a wiring board 2, a semiconductor assembly 6A, a semiconductor assembly 6B, and a sealing part 11.

Here, the semiconductor assembly 6A is a section composed of a multilayer substrate 5A and at least one semiconductor element 1 (which may include wiring, such as pins 4) mounted on the multilayer substrate 5A. Further the semiconductor assembly 6B is a section composed of a multilayer substrate 5B and at least one semiconductor element 1 mounted on the multilayer substrate 5B.

The semiconductor module 10 has at least one of the semiconductor assemblies 6A and 6B, which are connected to the wiring board 2. The wiring board 2 and the semiconductor assemblies 6A and 6B are sealed by a resin in a case 8 by a potting or molding method. The sealing part 11 does not exist on the lower surface side of the multilayer substrates 5A and 5B.

Further, the semiconductor module 10 is fastened to a cooler 30, which cools the semiconductor module 10 (the multilayer substrates 5A and 5B), by screws 9 or the like. A heat conduction sheet 20 is placed between the semiconductor module 10 and the cooler 30 (the mounting surface).

The semiconductor elements 1 are power chips such as insulated gate bipolar transistors (IGBTs) or diode chips, and various Si devices, SiC devices, GaN devices and the like can be used. Further, a combination of these devices may be also used. For example, a hybrid module or the like using a Si-IGBT and a SiC-SBD can be used. The number of semiconductor elements 1 mounted is not limited to the illustrated form, and a plurality of the semiconductor elements 1 can be mounted.

The wiring board 2 is a board having a wiring layer electrically connected to the electrodes of the semiconductor elements 1 and is placed on the upper surface side of the semiconductor elements 1. The wiring board 2 has a structure in which both surfaces of an insulating substrate are covered with metal foils (metal wiring plates), and the metal foil on the lower surface side is formed so as to face the semiconductor elements 1. The wiring board 2 may be a so-called printed circuit board. The insulating substrate preferably uses a material having low dielectric constant and high thermal conductivity, and uses, for example, $Si_3N_4$, AlN, or $Al_2O_3$. Further, the metal foils preferably use a material having low electrical resistance and high thermal conductivity, and can use, for example, Cu.

One end of each of the pins 4 is bonded to the upper surface of each of the semiconductor elements 1 by solder, and the other end is used for connection to the wiring board 2. The pins 4 can use a metal having low electrical resistance and high thermal conductivity, such as Cu. The pins 4 are, in some cases, connected to a take-out terminal when connected to the wiring board 2 on the upper surface side. The pins 4 may alternatively be connected to a lead frame. Further, for the wiring from the upper surface of the semiconductor elements 1, a wire made of a lead frame, Al, or the like other than the pins 4 may be used.

The multilayer substrate 5A is composed of an insulating substrate 52 at the middle, a first electrically conductive plate 51 formed on the upper surface of the insulating substrate 52, and a second electrically conductive plate 53 formed on the lower surface thereof. As the insulating substrate 52, a material having superior electrical insulation and thermal conductivity, such as $Al_2O_3$, AlN, or SiN, can be used. In particular, for high withstand voltage applications, a material having both electrical insulation and thermal conductivity is preferred, and AlN or SiN can be used, but the material is not limited thereto.

For the first electrically conductive plate 51 and the second electrically conductive plate 53, a metal material (metal foil) having superior electrical conductivity and workability, such as Cu or Al, can be used. In the present specification, the second electrically conductive plate 53 made of Cu may be referred to as a back surface copper plate. The electrically conductive plates 51 and 53 may be made of Cu or Al that has been subjected to a treatment such as Ni plating for the purpose of anti-corrosion or the like.

As the method of placing the electrically conductive plates 51 and 53 on the insulating substrates 52, a direct bonding method (the direct copper bonding method) or a brazing material bonding method (the active metal brazing method) is adopted. The same structure applies to the multilayer substrate 5B. The peripheral edge of the insulating substrates 52 preferably protrudes outward beyond the peripheral edges of the electrically conductive plates 51 and 53.

The lower surfaces of the semiconductor elements 1 and the first electrically conductive plate 51 of the multilayer substrate 5A are electrically and thermally bonded by solder. Further, the first electrically conductive plate 51 and the second electrically conductive plate 53 of the multilayer substrate 5A are electrically isolated. The second electrically conductive plate 53 (the back surface copper plate) and the upper surface (mounting surface, which is a mounting plate 30b to be described later) of the cooler 30 are attached through the intermediary of the heat conduction sheet 20.

Further, the lower surfaces of the semiconductor elements 1 and the first electrically conductive plate 51 of the multilayer substrate 59 are electrically and thermally bonded by solder. In the case of the multilayer substrate 5B also, the first electrically conductive plate 51 and the second electrically conductive plate 53 are electrically isolated. The second electrically conductive plate 53 and the upper surface of the cooler 30 are attached through the intermediary of the heat conduction sheet 20.

The heat conduction sheet 20 is formed of a material having high thermal conductivity. Further, the heat conduction sheet 20 is formed of a material having high thermal conductivity. Further, the heat conduction sheet 20 is in contact with the multilayer substrates 5A and 5B, which are provided with the semiconductor elements 1, and the cooler 30, and can therefore conduct the heat generated at the semiconductor elements 1 to the cooler 30 so as to dissipate the heat.

The cooler 30 is composed of a radiating fin 30a made of a material having high thermal conductivity, such as Al, Cu or the like, and a mounting plate 30b on which the semiconductor module 10 is mounted. The surface of the mounting plate 30b without the radiating fin 30a corresponds to "the mounting surface" of the present invention. As the cooler 30, a heat radiating fin composed of a plurality of flow paths in which a large number of plate-shaped fins are arranged in parallel may be used.

Figure 2:
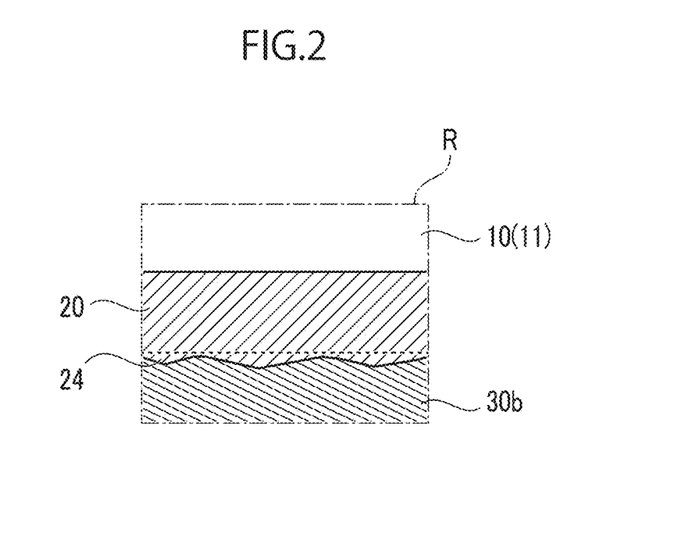
FIG. 2 is a sectional view of a region R of FIG. 1.

FIG. 2 is an enlarged view of a region R of FIG. 1.

The semiconductor device 100 is used for, for example, power conversion. In this case, the semiconductor elements 1 (the multilayer substrates 5A and 5B) generate heat. Therefore, it is necessary to keep the temperatures of the semiconductor elements 1 to a certain level or lower, and the cooler 30 is therefore installed to the back surface side of the semiconductor module 10.

A gap may be generated at the surface where the semiconductor nodule 10 and the cooler 30 are in contact with each other due to the macroscopic warping or undulation of the semiconductor module 10. Further, there are microscopic fine irregularities due to the roughness of the mounting surface of the cooler 30, providing no smoothness. The term "warping" refers to the deformation of the entire semiconductor module 10 such that, for example, the peripheral portion of the semiconductor module 10 is lifted or the peripheral portion thereof is lowered.

If an air layer 24 having low thermal conductivity is generated between the sealing part 11 of the semiconductor module 10 and the cooler 30, then heat cannot be conducted, inconveniently causing thermal resistance to increase. Therefore, the heat conduction sheet 20 is required to fill the space so as not to allow a gap to be generated even when the warping, undulation or fine irregularities described above occur. The heat conduction sheet 20 is required to adapt to the thermal deformation (expansion) of the semiconductor module 10 thereby to prevent the occurrence of a gap.

In the present embodiment, as the heat conduction sheet 20, a carbon sheet (graphite sheet or the like) having a thickness of about 25 µm to about 100 µm is adopted. Advantages of such a carbon sheet include its high thermal conductivity, 10 to 40 W/mK (in a Z-direction), as compared with the thermal conductivity of a soft heat conduction layer, such as grease (1 to 4 W/mK), and high workability.

A carbon sheet itself is hard, and if the carbon sheet is used as it is, then the heat conduction sheet 20 cannot accommodate warping or irregularities, causing a gap to be generated between the semiconductor module 10 and the cooler 30, thus preventing conduction of heat in some cases. As a solution, the screws 9 (refer to FIG. 1) are tightened to apply a load between the semiconductor module 10 and the cooler 30 thereby to accommodate the irregularities of the semiconductor module 10 and the cooler 30 by the deformation of the heat conduction sheet 20. This enables heat to be conducted without generating the air layer 24. The heat conduction sheet 20 can be expected to exhibit higher heat dissipation effect than a soft heat conduction layer such as grease.

A Young's modulus (Y1) of a carbon sheet preferably satisfies a condition of 5 GPa≤Y1≤15 GPa (unit: GPa).

The carbon sheet is a sheet-like member obtained by compressing a material mainly containing carbon, and may be a graphite sheet or the like. The term "mainly" means that the material contains carbon in 90 wt % or more, excluding unavoidable impurities, and may consist only of carbon. Further, carbon fibers of polyacylonitrile (PAN) type, pitch type or the like, or carbon nanofibers may be solidified into a sheet. At that time, the diameter of the carbon fiber is preferably 5 μm to 10 μm from the viewpoint of denseness, and the diameter of the carbon nanofiber is preferably 1 nm to 50 nm.

Further, a sheet made of only glassy carbon may be used, or a sheet containing a resin other than carbon may be used. If a resin is contained, then the carbon content rate is preferably 80 wt % to 99 wt %, and more preferably 90 wt % to 95 wt % from the viewpoint of thermal conductivity and elasticity. If the content rate is lower than this, then the formability is impaired, and if the content is higher than this, then the thermal conductivity is deteriorated, which is undesirable. Further, as the resin, an epoxy resin, a phenol resin, a maleimide resin or the like is used.

Figure 3:
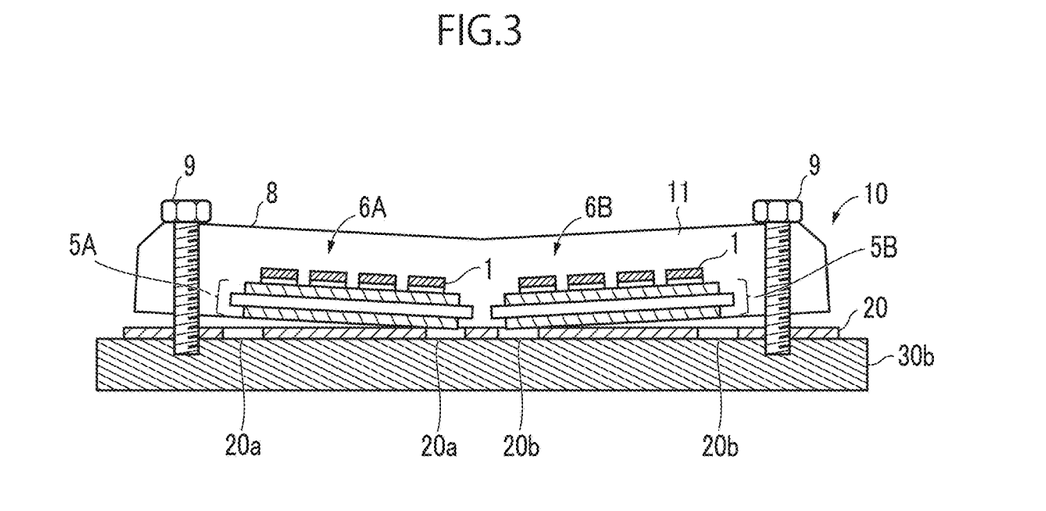
FIG. 3 is a sectional view illustrating the warping of the semiconductor module.

FIG. 3 is a sectional view of the semiconductor device 100 when warping takes place (some members not being illustrated). In the semiconductor module 10 of the semiconductor device 100, forward warping (protruding downward), in which the peripheral portion (both ends in the longitudinal direction) is lifted, frequently takes place.

When the forward warping takes place, a load is applied between the semiconductor module 10 and the cooler 30 by fastening with the screws 9. A problem at this time is that the protruding portion of the lower surface of the semiconductor module 10 (e.g., the end portions of the back surface copper plates of the multilayer substrates 5A and 5B) pushes the heat conduction sheet 20 due to the screw tightening load or the like, and stress is concentrated. More specifically, the end portions of the multilayer substrates 5A and 5B thrust against the heat conduction sheet 20 (refer to FIG. 11). The term "the end portions" in this case specifically refer to the edge portion (the outer edge) of the back surface of the second electrically conductive plate 53.

Then, when the end portions of the multilayer substrates 5A and 5B are subjected to the repulsive three from the heat conduction sheet 20, the semiconductor module 10 (the sealing part 11) is damaged by the repulsive force. In particular, the sealing part 11 having the lowest rigidity develops a crack or the like due to the application of a bending stress that causes switching from the forward warping to the backward warping illustrated in FIG. 3 to take place in the entire semiconductor mod 10.

The heat conduction sheet 20 of the present embodiment is provided with recesses 20a corresponding to the multilayer substrate 5A and recesses 20b corresponding to the multilayer substrate 5B to prevent damage to the semiconductor module 10. More specifically, the recesses are provided, corresponding to the places where the back surface (the end portions of the bottom part) of the second electrically conductive plate 53 comes in contact with the heat conduction sheet 20.

Figure 4:
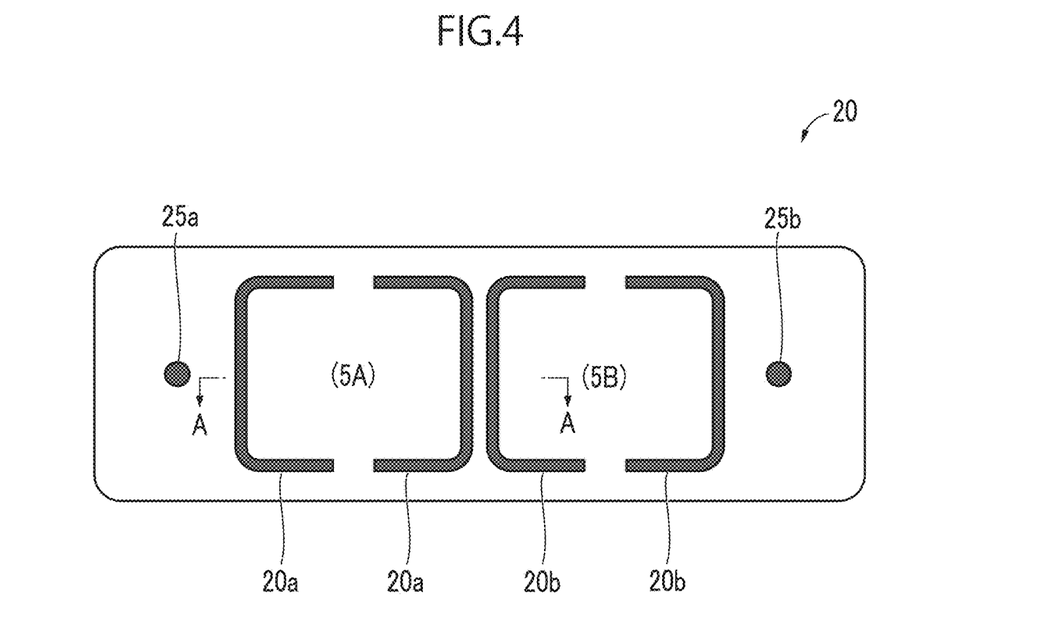
FIG. 4 is a diagram illustrating a heat conduction sheet of the semiconductor module viewed from above.

Referring now to FIG. 4, the heat conduction sheet 20 according to the present embodiment will be described in detail. In the following, a case will be described, assuming that the two multilayer substrates 5A and 5B are placed adjacently in the longitudinal direction of the semiconductor module 10; however, the number of the multilayer substrates may be one or three or more. Further, the number and the placement of the multilayer substrates change, depending also on the shape (e.g., square) of the semiconductor module 10 as viewed from above.

FIG. 4 is a diagram illustrating the heat conduction sheet 20 viewed from above. The heat conduction sheet 20 is provided with the recesses 20a and 20b. The screw holes 25a and 25b for fastening the semiconductor module 10 and the cooler 30 by the screws 9 are provided on the outer side of the recesses 20a and 20b. The term "the outer side" in this case refers to a position closer to the end portions in the longitudinal direction than the recesses 20a and 20b when the heat conduction sheet 20 is substantially rectangular. Thus, the heat conduction sheet 20 is preferably placed also below the fastening parts such as screws from the viewpoint of thermal conductivity.

The recesses 20a and 20b are shaped along the outer edges of the two multilayer substrates 5A and 5B, respectively. The multilayer substrates 5A and 5B are both provided with the second electrically conductive plates 53 on the bottom pails thereof. Further, the edge of the bottom part of the one second electrically conductive plate 53 has two opposing sides that extend in the lateral direction of the heat conduction sheet 20. Further, the edge of the bottom part of the one second electrically conductive plate 53 has two opposing sides that extend in the longitudinal direction of the heat conduction sheet 20. As illustrated in FIG. 4, the heat conduction sheet 20 is primarily rectangular, so that the direction of the short sides of the rectangle is the lateral direction. It should be noted that "the lateral direction of the heat conduction sheet 20" coincides with the lateral direction of the semiconductor module 10.

The recesses 20a have a shape corresponding to the edge of the bottom part of the second electrically conductive plate 53 of the multilayer substrate 5A. The recesses 20a have interrupted places in the longitudinal direction of the heat conduction sheet 20; however, the recesses 20a may alternatively have an uninterrupted shape. The recesses 20a are shaped to correspond to the two opposing sides of the edge that extend in the lateral direction and the two opposing sides of the edge that extend in the longitudinal direction; however, the recesses 20a may alternatively have a shape that corresponds to a part of the edge.

Further, the recesses 20b are shaped along the edge of the bottom part of the second electrically conductive plate 53 of the multilayer substrate 5B. As viewed from above, the line widths of the recesses 20a and 20b are preferably 0.5 mm to 3 mm, and more preferably 1 mm to 2 mm to reduce the stress to the sealing part 11 and from the viewpoint of thermal conductivity.

Figure 5:
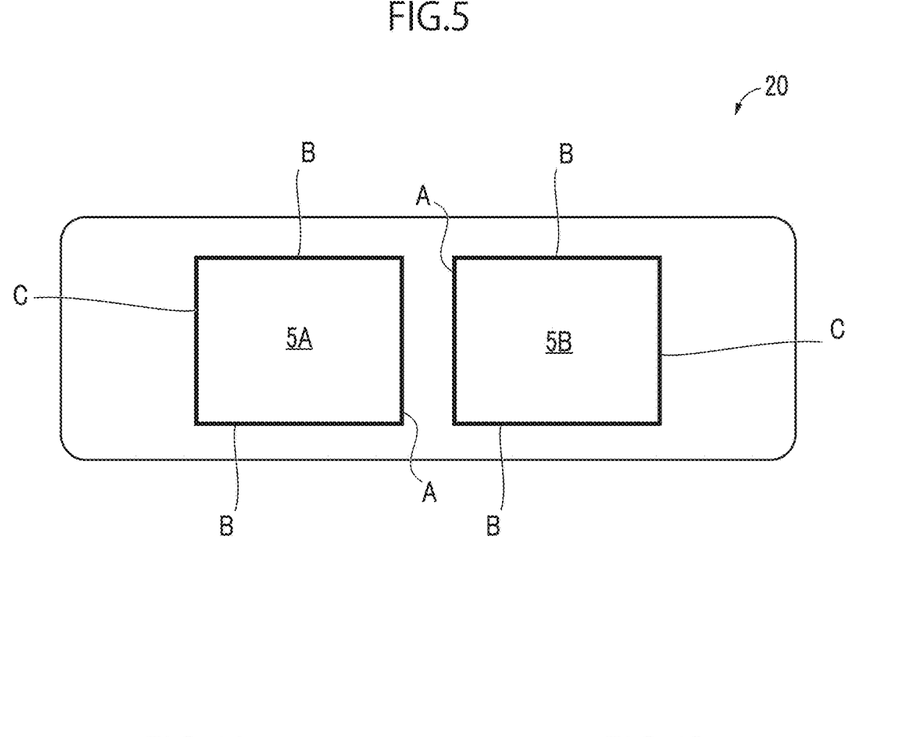
FIG. 5 is a diagram illustrating the designations of the sides of multilayer substrates (two)
Figure 6A:
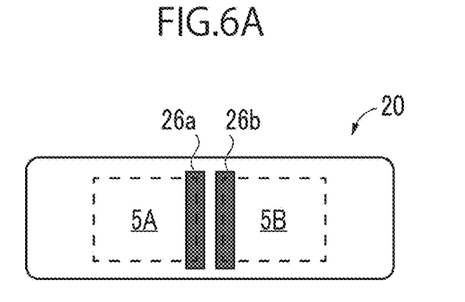
FIG. 6A is a diagram illustrating the recesses for dealing with forward warping (sides A)
Figure 6B:
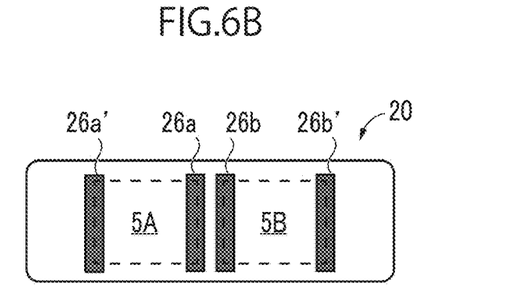
FIG. 6B is a diagram illustrating the recesses for dealing with the forward warping (sides A+C)
Figure 6C:
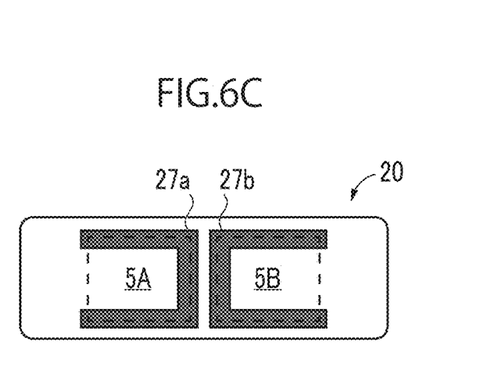
FIG. 6C is a diagram illustrating the recesses for dealing with the forward warping (sides A+B)
Figure 6D:
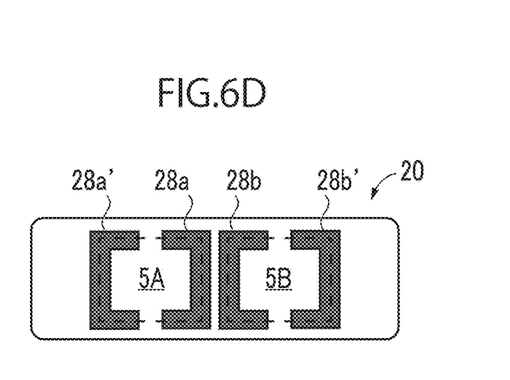
FIG. 6D is a diagram illustrating the recesses for dealing with the forward warping (sides A+B+C)

In FIG. 4 and FIG. 5, the multilayer substrates 5A and 5B are placed such that the longitudinal direction thereof is parallel to the longitudinal direction of the semiconductor module 10. Alternatively, however, the multilayer substrates 5A and 5B may be placed such that the lateral direction thereof is parallel to the longitudinal direction of the semiconductor module 10.

In the present embodiment, when the semiconductor module 10 develops the forward warping in the longitudinal direction thereof, the semiconductor module 10 protrudes downward. Then, the central portion of the semiconductor module 10, that is, the end portions of the bottom parts of the second electrically conductive plates 53 of the multilayer substrates 5A and 5B enter the recesses 20a and 20b (refer to FIG. 3). The end portions of the bottom parts of the second electrically conductive plates 53 do not come in direct contact with the surface of the heat conduction sheet 20, thus suppressing the repulsive force applied to the semiconductor module 10 (the sealing part 11) from the heat conduction sheet 20.

The recesses 20a and 20b may be cutouts that pass through to the bottom surface of the heat conduction sheet 20. However, if the recesses 20a and 20b do not pass through to the bottom surface of the heat conduction sheet 20, it is preferable that the recesses 20a and 20b can be placed without interruption so as to surround the outer edges of the second electrically conductive plates 53 exposed from the sealing part 11. In this case, "placed so as to surround" means the placement in which the recesses 20a and 20b straddle the outer edges of the bottom parts of the second electrically conductive plates 53 as viewed from above. A carbon sheet having at least one recess can be processed to form the recess into a predetermined shape by molding, pressing, cutting, or the like.

On the other hand, if the recesses 20a and 20b pass through to the bottom surface of the heat conduction sheet 20 it is necessary to provide a part of the recesses 20a and 20b with discontinuous places (cut places), as illustrated in FIG. 4, so as not to isolate the heat conduction sheet 20. In the case where the recesses 20a and 20b do not pass through, the depths of the recesses 20a and 20b are preferably equal to or more than 40% of the thickness of the heat conduction sheet 20. Setting to the above range causes the end portions of the bottom parts of the second electrically conductive plates 53 to fit in the recesses 20a and 20b, thus making it possible to reduce the stress to the heat conduction sheet 20.

The placement of the recesses changes according to which of the forward warping and the backward warping of the semiconductor module 10 has to be dealt with. Therefore, the following will describe various patterns with reference to FIG. 5 to FIG. 10D.

As illustrated in FIG. 5, among the sides (edges) of the second electrically conductive plates 53 of the two multi-layer substrates 5A and 5B placed on the heat conduction sheet 20 as viewed from above, the two adjacent sides which extend in the lateral direction of the semiconductor module 10 and face each other are denoted as sides A. Further, the two sides which extend in the lateral direction and face the sides A are denoted as sides C, and the two sides (two pairs) which extend in the longitudinal direction and face each other are denoted as sides B.

If the semiconductor module 10 is rectangular, then the semiconductor module 10 frequently develops the forward warping or the backward warping in the longitudinal direction. As illustrated in FIG. 6A to FIG. 6D, as the measures for dealing with the forward warping, the heat conduction sheet 20 is preferably provided with (1) recesses 26a and 26b corresponding to the sides A (refer to FIG. 6A), (2) recesses 26a, 26a', 26b, and 26b' corresponding to the sides A and the sides C (refer to FIG. 6B), (3) recesses 27a and 27b corresponding to the sides A and the sides B (refer to FIG. 6C), and (4) a recess 28a and recesses 28a', 28b and 28b' corresponding to the sides A, sides B and the sides C (refer to FIG. 6D).

Figure 7A:
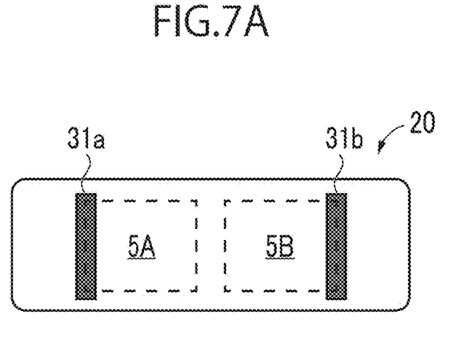
FIG. 7A is a diagram illustrating the recesses for dealing with backward warping (sides C)
Figure 7B:
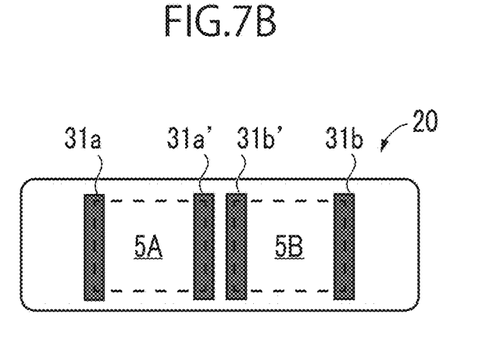
FIG. 7B is a diagram illustrating the recesses for dealing with the backward warping (sides C+A)
Figure 7C:
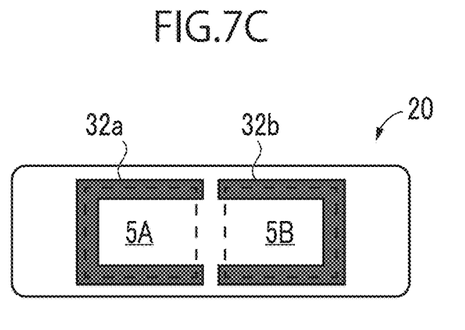
FIG. 7C is a diagram illustrating the recesses for dealing with the backward warping (sides C+B)
Figure 7D:
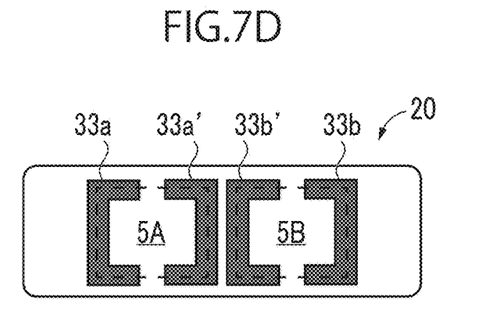
FIG. 7D is a diagram illustrating the recesses for dealing with the backward warping (sides C+B+A)

Meanwhile, as illustrated in FIG. 7A to 7D, as the measures for dealing with the backward warping of the semiconductor module 10, the heat conduction sheet 20 is preferably provided with (1) recesses 31a and 31b corresponding to the sides C (refer to FIG. 7A), (2) recesses 31a, 31a', 31b and 31b' corresponding to the sides C and the sides A (refer to FIG. 7B), (3) recesses 32a and 32b corresponding to the sides C and the sides B (refer to FIG. 7C), and (4) recesses 33a, 33a', 33b and 33b' corresponding to the sides C, the sides B, and the sides A (refer to FIG. 7D). The placement of the aforesaid recesses for dealing with the forward warping or the backward warping applies to the case where the number of multilayer substrates is even (e.g., four).

Even when there is only one multilayer substrate, the central portion of the multilayer substrate protrudes downward and thrusts against the heat conduction sheet 20, causing the bottom part of the second electrically conductive plate 53 to be subjected to a high repulsive force from the heat conduction sheet 20 in the case of the forward warping. For this reason, a recess should be formed at the location of the heat conduction sheet 20 that corresponds to the protrusion of the central portion. The term "the protrusion" means the protrusion toward the heat conduction sheet 20, and the phrase "the recess corresponding to the protrusion" means the recess provided according to the position where at least a part of the protrusion enters.

Further, if three or more multilayer substrates are placed in the semiconductor module 10, then the second electrically conductive plate 53 positioned at the center in the longitudinal direction of the semiconductor module 10 protrudes downward, applying a large force to the heat conduction sheet 20. For this reason, a recess corresponding to the location of the second electrically conductive plate 53 which is positioned at the center of the semiconductor module 10 and which protrudes should be formed in the heat conduction sheet 20.

Figure 8:
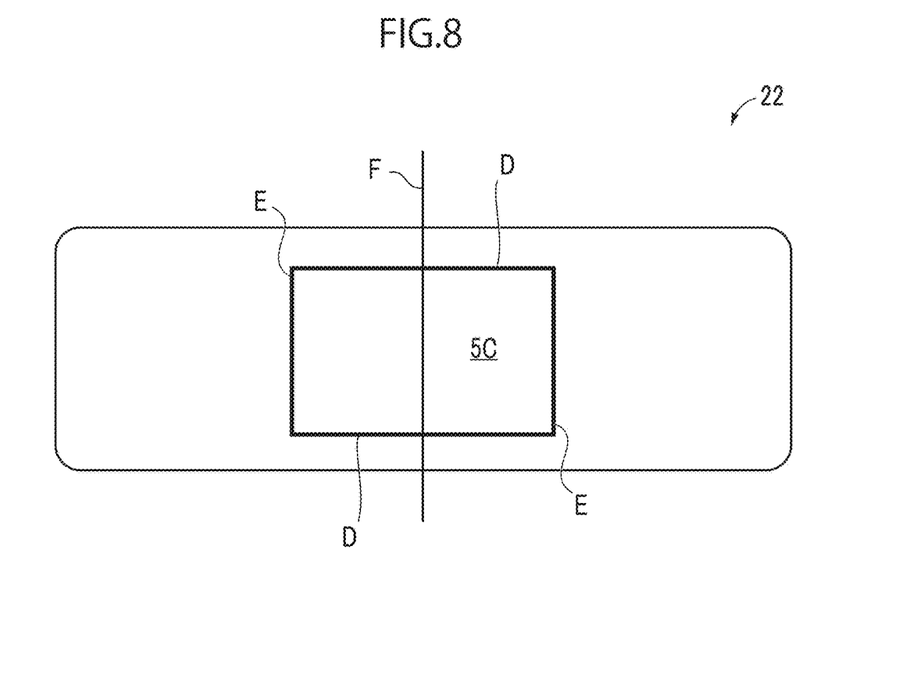
FIG. 8 is a diagram illustrating the designations of the sides and the centerline of a multilayer substrate (one)
Figure 9A:
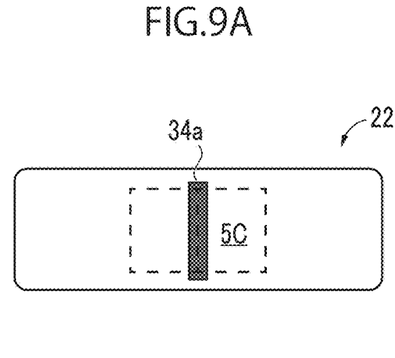
FIG. 9A is a diagram illustrating the recesses for dealing with the forward warping (side F)
Figure 9B:
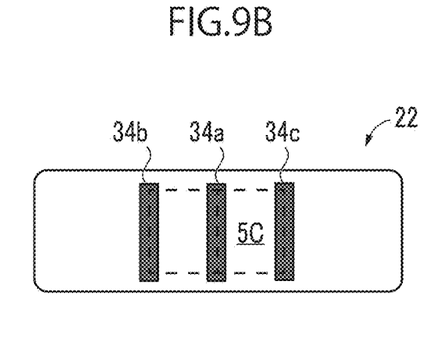
FIG. 9B is a diagram illustrating the recesses for dealing with the forward warping (sides F+E)
Figure 9C:
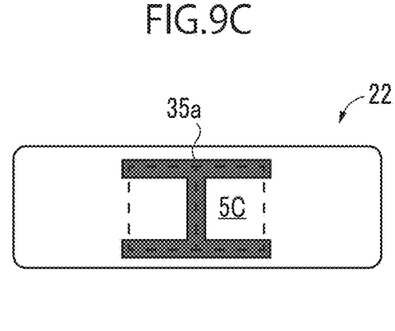
FIG. 9C is a diagram illustrating the recesses for dealing with the forward warping (sides F+D)
Figure 9D:
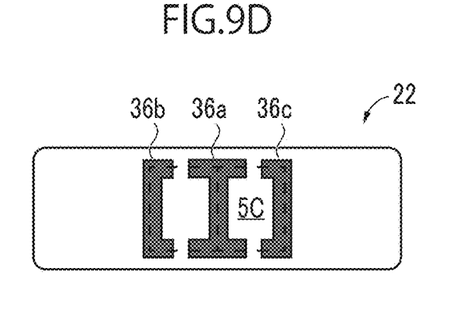
FIG. 9D is a diagram illustrating the recesses for dealing with the forward warping (sides F+D+E)

As illustrated in FIG. 8, among the sides (edges) of the second electrically conductive plate 53 of one multilayer substrate 5C placed on a heat conduction sheet 22 as viewed from above, the two adjacent sides which extend in the longitudinal direction of the semiconductor module 10 and face each other are denoted as sides D. Further, the two sides which extend in the lateral direction and face each other are denoted as sides E, and the centerline of the sides D that extends in the lateral direction is denoted as a line F.

If the semiconductor module 10 is rectangular, then the sides in the longitudinal direction of the semiconductor module 10 frequently develop the forward warping or the backward warping. As illustrated in FIG. 9A to FIG. 9D, as the measures for dealing with the forward warping, the heat conduction sheet 22 is preferably provided with (1) a recess 34a corresponding to the line F (refer to FIG. 9A), (2) recesses 34a, 34b and 34c corresponding to the line F and the sides E (refer to FIG. 9B), (3) a recess 35a corresponding to the line F and the sides D (having a shape that includes the recess 34a) (refer to FIG. 9C), and (4) recesses 36a, 36b and 36c corresponding to the line F, the sides E and the sides D (refer to FIG. 9D).

Figure 10A:
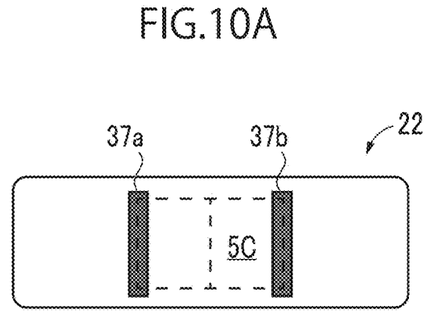
FIG. 10A is a diagram illustrating the recesses for dealing with the backward warping (sides E)
Figure 10B:
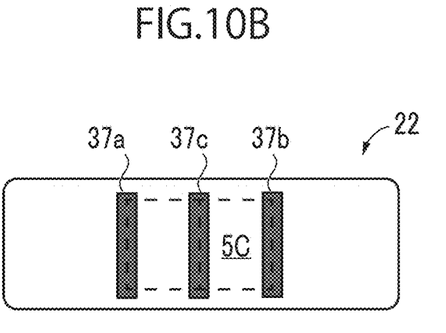
FIG. 10B is a diagram illustrating the recesses for dealing with the backward warping (sides E±F)
Figure 10C:
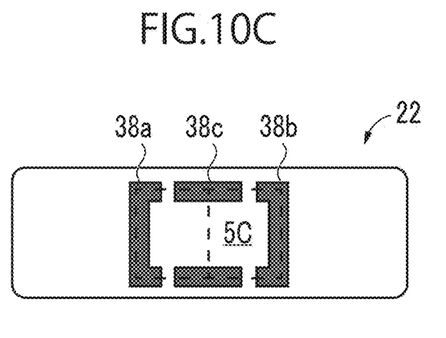
FIG. 10C is a diagram illustrating the recesses for dealing with the backward warping (sides D+E)
Figure 10D:
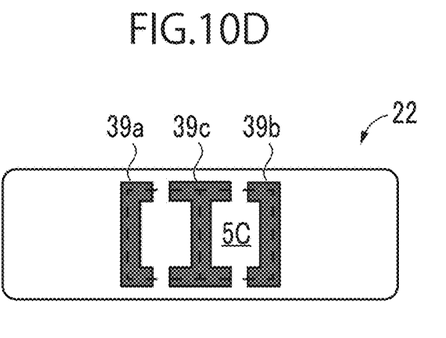
FIG. 10D is a diagram illustrating the recesses for dealing with the backward warping (sides D+F±E)

Meanwhile, as illustrated in FIG. 10A to FIG. 10D, as the measures for dealing with the backward warping of the semiconductor module 10, the heat conduction sheet 22 is preferably provided with (1) recesses 37a and 37b corresponding to the sides E (refer to FIG. 10A), (2) recesses 37a, 37b and 37c corresponding to the sides E and the line F (refer to FIG. 10B), (3) recesses 38a, 38b and 38c corresponding to the sides D and the sides E (refer to FIG. 10C), and (4) recesses 39a, 39b and 39c corresponding to the sides D, the sides E and the line F (refer to FIG. 10D). The placement of the aforesaid recesses for dealing with the forward warping or the backward warping applies to the case where the number of the multilayer substrates is odd (e.g., three).

Figure 11:
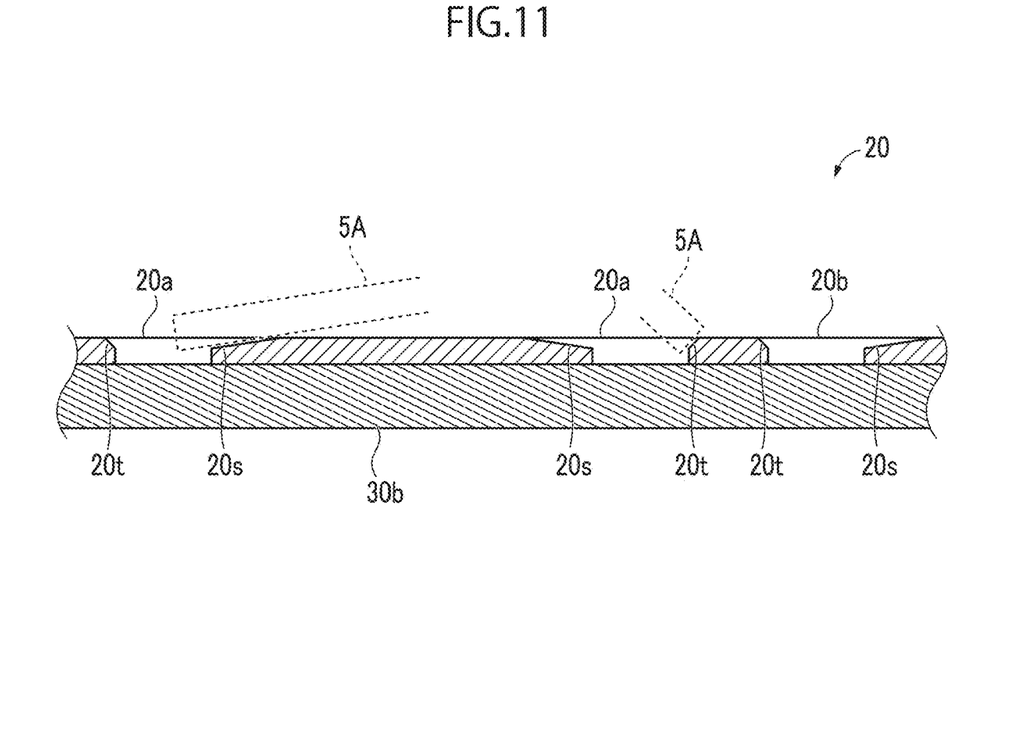
FIG. 11 is a sectional view taken along A-A of FIG. 4.

Next, FIG. 11 is a sectional view taken along A-A of FIG. 4.

In the vicinity of the recesses 20a of the heat conduction sheet 20, sloped portions 20s, which decrease the thickness of the heat conduction sheet 20 toward the recesses 20a, may be provided. The sloped portions 20s have inclinations (about 30 degrees to about 45 degrees with respect to a horizontal plane) corresponding to the warping of the multilayer substrate 5A. Thus, the end portions of the second electrically conductive plate 53 of the multilayer substrate 5A come in contact with the sloped portions 20s, so that the area of contact between the second electrically conductive plate 53 and the heat conduction sheet 20 increases, and the stress applied to the heat conduction sheet 20 by the second electrically conductive plate 53 reduces. This makes it possible to prevent damage to the semiconductor module 10 (the sealing part 11). Similar sloped portions 20s are provided in the vicinity of the recesses 20b.

Further, the regions between the recesses 20a and the recesses 20b of the heat conduction sheet 20 are provided with sloped portions 20t. The sloped portions 20t have inclinations (about 60 degrees to about 80 degrees with respect to a horizontal plane) which correspond to large warping of the multilayer substrates 5A and 5B and which decrease the thickness toward the recesses 20a and 20b. This structure also leads to prevention of damage to the semiconductor module 10.

Figure 12:
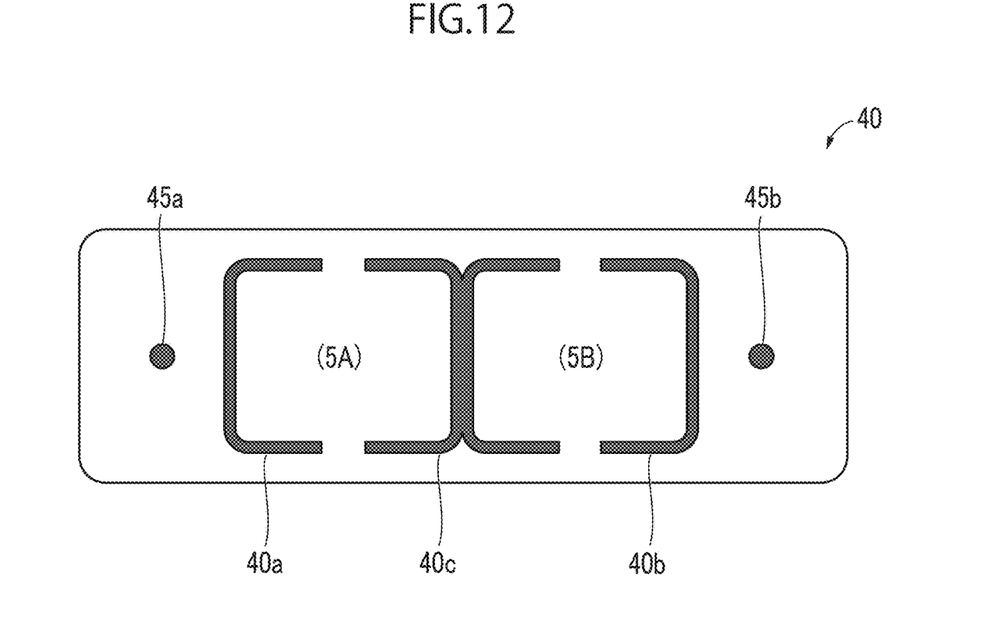
FIG. 12 is a diagram illustrating a heat conduction sheet of a semiconductor module viewed from above (modified embodiment 1)
Figure 13:
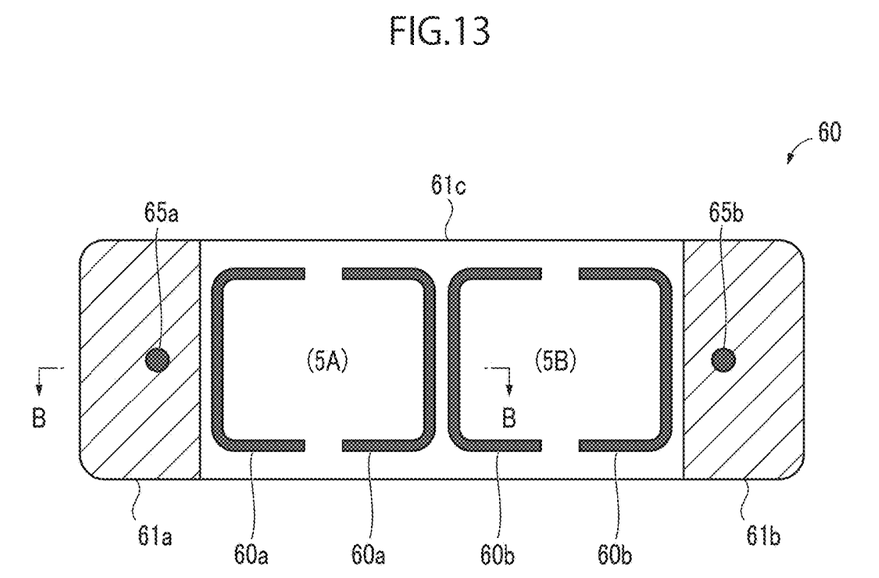
FIG. 13 is a diagram illustrating a heat conduction sheet of a semiconductor module viewed from above modified embodiment 2)
Figure 14:
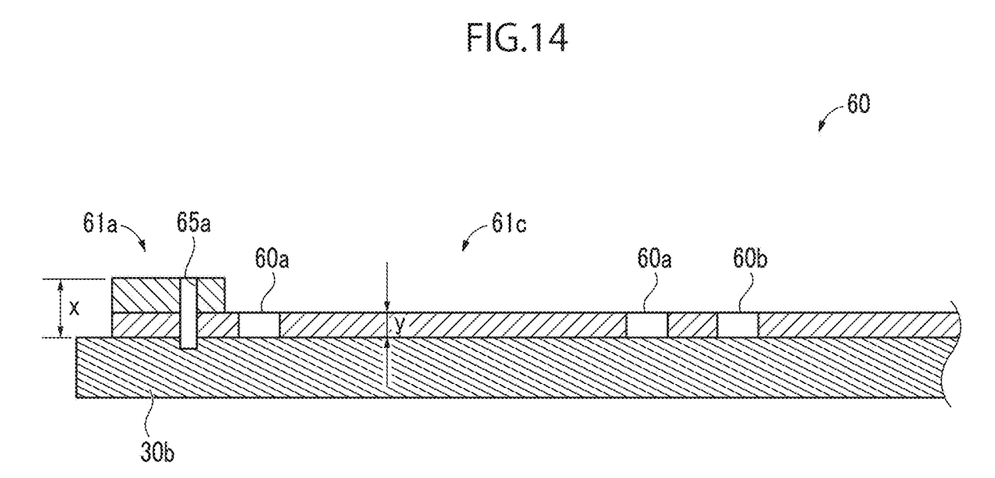
FIG. 14 is a sectional view taken along B-B of FIG. 13.

Referring now to FIG. 12 to FIG. 14, a modified embodiment of the heat conduction sheet will be described.

Modified embodiment 1 (a semiconductor device 200) is provided with a semiconductor nodule 10, a cooler 30, and a heat conduction sheet 40 placed between the semiconductor module 10 and the cooler 30 (mounting surface).

Referring to FIG. 12, the heat conduction sheet 40 has recesses 40a to 40c. A multilayer substrate 5A of the semiconductor module 10 is placed in the region between the recess 40a and the recess 40c, and a multilayer substrate 5B of the semiconductor module 10 is placed in the region between the recess 40b and the recess 40c. The heat conduction sheet 40 does not have to have all the recesses 40a to 40c. For example, considering that the forward warping occurs more frequently, at least the recess 40c is to be provided, and the recess 40a or the recess 40b may be provided, as necessary.

Here, the recess 40C is a recess common to the multilayer substrate 5A and the multilayer substrate 5B. Screw holes 45a and 45b are provided on the outer side of the recesses 40a and 40b.

When the forward warping takes place in the semiconductor device 200, the bottom surfaces of the second electrically conductive plates 53 of the multilayer substrates 5A and 5B come in contact with the sloped portions (refer to FIG. 11). This results in an increase in the area of contact between each of the second electrically conductive plates 53 and the heat conduction sheet 40, thus reducing the stress applied to the heat conduction sheet 40 by the second electrically conductive plate 53. Thus, the heat dissipation performance can be enhanced while preventing damage to the semiconductor module 10 (the sealing part 11) at the same time.

Next, modified embodiment 2 (a semiconductor device 300) is provided with a semiconductor module 10, a cooler 30, and a heat conduction sheet 60 placed between the semiconductor module 10 and the cooler 30 (a mounting surface).

Referring to FIG. 13, the heat conduction sheet 60 has recesses 60a and 60b, a multilayer substrate 5A of the semiconductor module 10 is placed in the region between the recesses 60a, and a multilayer substrate 5B of the semiconductor module 10 is placed in the region between the recesses 60b. In this case also, the heat conduction sheet 60 does not have to have all the recesses 60a and 60b and alternatively can have, for example, recesses that combine, as necessary, the elements constituting the recesses 60a and 60b.

Here, the end portions (the hatched portions) in the longitudinal direction of the heat conduction sheet 60 are places having fastener components such as screws, and making the end portions thicker than that of the central portion of the heat conduction sheet 60 enhances the overall strength of the heat conduction sheet 60. Further, the central portion (the portion where the multilayer substrates 5A and 5B are placed on the upper surface thereof) of the heat conduction sheet 60 is thinner than both end portions thereof, thus making it possible to adapt to the warping of the semiconductor module 10 so as to maintain the heat dissipation performance. The central portion of the heat conduction sheet 60 may be composed of a single carbon sheet 61c, and carbon sheets 61a and 61b of the end portions may be placed thereon.

The thicker portion of the heat conduction sheet 60 preferably extends over a region from the edges in the longitudinal direction of the carbon sheet 61c to the portions where the recesses 60a and 60b exist, and preferably includes the fastening components such as screws. The carbon sheets of the both end portions (the hatched portions) are not limited to two-ply and may alternatively be three-ply or more. Further, the overlapping carbon sheets may have thicknesses that are different from each other.

There are screw holes 65a and 65b on the outer side of the recesses 60a and 60b, but both end portions (the hatched portions) of the heat conduction sheet 60 are thicker. Consequently, especially when the semiconductor module 10 develops the forward warping, the stress generated in the entire semiconductor device 300 can be reduced. The region between the multilayer substrate 5A and the multilayer substrate 5B may be used for the recess common to both multilayer substrates, as illustrated in FIG. 12.

Next, FIG. 14 is a sectional view taken along B-B of FIG. 13.

Here, if the thickness of the end portions of the heat conduction sheet 60 is denoted as x, and the thickness of the central portion of the heat conduction sheet 60 is denoted as y, a relationship of $2y<x<3y$ preferably holds. Designing so as to satisfy the condition makes it possible to reduce the stress generated in the entire semiconductor module 10 while enhancing the heat dissipation performance at the same time. The widths in the longitudinal direction of the end portions are preferably 5 mm to 30 mm, and more preferably 10 mm to 20 mm from the viewpoint of fixability and fastenability of the heat conduction sheet 60.

Although the embodiments for carrying out the present invention have been described above, the present invention is not limited to the foregoing embodiments, and can be modified as appropriate within a range that does not deviate from the gist of the present invention.

In FIG. 11, although the heat conduction sheet 20 has the sloped portions 20s and 20t, this configuration is not essential. Alternatively, the sloped portions may not be provided, and conversely, the end portions (bottom end portions) of the back surface copper plates of the multilayer substrates 5A and 5B may be diagonally cut such that the bottom end portions do not come in contact with the heat conduction sheet 20.

In the foregoing embodiments, the case has been described where the warping (forward warping) occurs in which mainly the region between the two multilayer substrates becomes a trough, and the recesses are provided at least in the region between the two multilayer substrates. However, similar warping can occur also in the case where there is only one multilayer substrate, so that recesses corresponding to the outer edge of the bottom part of the multilayer substrate are preferably provided.

The recesses may be deep enough to allow at least a part of the bottom end portion of the multilayer substrate (the second electrically conductive plate) to enter therein. Therefore, the recesses may be ones that do not pass through to the bottom surface side of a heat conduction sheet, or ones (cutouts) that pass through to the bottom surface side. More specifically, the depth of the recesses is preferably 40% or more of the thickness of the heat conduction sheet 20.

By providing the recesses corresponding to the outer edge of the bottom part of the heat conduction sheet, the bottom end portion of the electrically conductive plate of the multilayer substrate can enter the recesses regardless of the direction of warping, and the repulsive force applied to the sealing part from the heat conduction sheet is reduced. Preferably, the recesses for the direction in which the warping is likely to occur are continuously formed and have a certain width. Further, the recesses for the direction in which the warping is less likely to occur may be intermittently formed or have a smaller width.

DESCRIPTION OF REFERENCE NUMERALS

1 semiconductor element
2 wiring board
4 pin
5A to 5C multilayer substrate
6A, 6B semiconductor assembly
8 case
9 screw
10 semiconductor module
11 sealing part
20, 22, 40, 60 heat conduction sheet
20a, 20b, 26a to 28b', 31a to 39c, 40a to 40c, 60a, 60b recess
20s, 20t sloped portion
24 air layer
25a, 25b, 45a, 45b, 65a, 65b screw hole
30 cooler
30a radiating fin
30b mounting plate
61a to 61c carbon sheet
100, 200, 300 semiconductor device

What is claimed is:

1. A semiconductor device comprising:
   a semiconductor module having
      at least one semiconductor assembly composed of
         a multilayer substrate which includes an insulating substrate, and an electrically conductive plate having edges to form a rectangular shape and provided at a bottom surface side of the insulating substrate, and
         a semiconductor element mounted on the multilayer substrate, and
         a sealing part which seals the at least one semiconductor assembly except a bottom part of the electrically conductive plate;
   a cooler which has a mounting surface on which the semiconductor module is mounted; and
   a heat conduction sheet which is placed between the semiconductor module and the mounting surface of the cooler and is in contact with the bottom part of the electrically conductive plate,
   wherein the heat conduction sheet has a recess corresponding to at least one edge of the electrically conductive plate and placed under the at least one edge of the electrically conductive plate, and only a bottom part of the at least one edge is entered in the recess along a whole length of the at least one edge.

2. The semiconductor device according to claim 1,
   wherein the semiconductor module has an M number (M: even number) of the semiconductor assemblies,
   each of the electrically conductive plates of the M number of semiconductor assemblies has the at least one edge that extends in a lateral direction of the semiconductor module, and
   the recess has a shape that corresponds to the at least one edge of each of the electrically conductive plates of the semiconductor assemblies.

3. The semiconductor device according to claim 2, wherein the at least one edge of one of the electrically conductive plates of the semiconductor assemblies and the at least one edge of another of the electrically conductive plates of the semiconductor assemblies are adjacent to each other at a central portion of the semiconductor module.

4. The semiconductor device according to claim 3, wherein the recesses corresponding to the at least one edge of one of the electrically conductive plates of the semiconductor assemblies and the at least one edge of another of the electrically conductive plates of the semiconductor assemblies are integrated into a common recess.

5. The semiconductor device according to claim 2,
   wherein each of the electrically conductive plates of the M number of the semiconductor assemblies further has an edge extending in a longitudinal direction of the semiconductor module, and
   the recess has a shape corresponding to the edge in the longitudinal direction.

6. The semiconductor device according to claim 1,
   wherein the semiconductor module has an N number (N: odd number) of the semiconductor assemblies placed in a longitudinal direction of the semiconductor module,
   one of the N number of the semiconductor assemblies is placed in a region at a center in the longitudinal direction, and
   the heat conduction sheet has another recess corresponding to a centerline extending in a lateral direction of the semiconductor module.

7. The semiconductor device according to claim 6,
   wherein the semiconductor module has an N number (N: odd number) of the semiconductor assemblies,
   each of the electrically conductive plates of the N number of the semiconductor assemblies has the at least one edge that extends in the lateral direction of the semiconductor module, and
   the recess has a shape that corresponds to the at least one edge of each of the electrically conductive plates of the semiconductor assemblies.

8. The semiconductor device according to claim 7, wherein the recesses corresponding to the at least one edge of one of the electrically conductive plates of the semiconductor assemblies and the at least one edge of another of the electrically conductive plates of the semiconductor assemblies are integrated into a common recess.

9. The semiconductor device according to claim 1,
wherein the semiconductor module has an N number (N: odd number) of the semiconductor assemblies,
each of the electrically conductive plates of the N number of semiconductor assemblies has the at least one edge that extends in a lateral direction of the semiconductor module, and
the recess has a shape that corresponds to the at least one edge of each of the electrically conductive plates of the semiconductor assemblies.

10. The semiconductor device according to claim 9, wherein the at least one edge of one of the electrically conductive plates of the semiconductor assemblies and the at least one edge of another of the electrically conductive plates of the semiconductor assemblies are adjacent to each other.

11. The semiconductor device according to claim 9,
wherein each of the electrically conductive plates of the N number of the semiconductor assemblies further has another edge extending in a longitudinal direction of the semiconductor module, and
the recess has a shape corresponding to the another edge in the longitudinal direction.

12. The semiconductor device according to claim 1, wherein the heat conduction sheet has a sloped portion that makes the heat conduction sheet thinner toward the recess.

13. The semiconductor device according to claim 1, wherein a Young's modulus Y of the heat conduction sheet satisfies a condition of $5\ \text{GPa} \leq Y \leq 15\ \text{GPa}$.

14. The semiconductor device according to claim 1, wherein the heat conduction sheet is formed of a carbon sheet.

15. The semiconductor device according to claim 1, wherein the heat conduction sheet is thicker at both end portions in a longitudinal direction than a central portion where the multilayer substrate is placed.

16. The semiconductor device according to claim 15, wherein in a case where a thickness of the both end portions is denoted as x, and a thickness of the central portion is denoted as y, a relationship of $2y < x < 3y$ holds.

17. The semiconductor device according to claim 1, wherein the electrically conductive plate includes a center portion and the edges surrounding the center portion, and the recess is not formed under the center portion.

18. The semiconductor device according to claim 1,
wherein only the at least one edge of the electrically conductive plate is dent when warping occurs on the semiconductor module, and
the recess is placed only under the at least one edge of the electrically conductive plate to prevent damage to the semiconductor module when the electrically conductive plate receives a repulsive force from the heat conduction sheet.

* * * * *